(12) United States Patent
Hammerschmidt

(10) Patent No.: US 11,204,233 B2
(45) Date of Patent: Dec. 21, 2021

(54) VECTOR LENGTH VARIANCE CHECK FOR FUNCTIONAL SAFETY OF ANGLE SENSORS

(71) Applicant: Infineon Technologies AG, Neubiberg (DE)

(72) Inventor: Dirk Hammerschmidt, Finkenstein (AT)

(73) Assignee: Infineon Technologies AG

( * ) Notice: Subject to any disclaimer, the term of this patent is extended or adjusted under 35 U.S.C. 154(b) by 92 days.

(21) Appl. No.: 16/715,084

(22) Filed: Dec. 16, 2019

(65) Prior Publication Data

US 2021/0180938 A1 Jun. 17, 2021

(51) Int. Cl.
*G01B 7/30* (2006.01)
*G01R 33/02* (2006.01)
*G01R 33/00* (2006.01)

(52) U.S. Cl.
CPC .............. *G01B 7/30* (2013.01); *G01R 33/02* (2013.01); *G01R 33/0094* (2013.01)

(58) Field of Classification Search
CPC ....... G01B 7/30; G01R 33/02; G01R 33/0094
See application file for complete search history.

(56) References Cited

U.S. PATENT DOCUMENTS

| 8,005,642 | B2* | 8/2011 | Hammerschmidt | G01D 5/2448 |
| | | | | 702/151 |
| 8,519,700 | B2* | 8/2013 | Jerance | G01D 5/145 |
| | | | | 324/207.25 |
| 9,279,702 | B2* | 3/2016 | Ritter | G01R 33/091 |
| 2004/0236510 | A1 | 11/2004 | Ockerse et al. | |
| 2009/0319120 | A1* | 12/2009 | Hatanaka | B62D 15/0215 |
| | | | | 701/29.2 |
| 2015/0108972 | A1 | 4/2015 | Zimmer et al. | |
| 2018/0356253 | A1 | 12/2018 | Hammerschmidt | |

FOREIGN PATENT DOCUMENTS

EP 2568254 A2 3/2013
EP 3502628 A1 6/2019

* cited by examiner

*Primary Examiner* — Reena Aurora
(74) *Attorney, Agent, or Firm* — Design IP

(57) ABSTRACT

A magnetic angle sensor system includes a first magnetic sensor configured to generate a first sensor signal, a second magnetic sensor configured to generate a second sensor signal, and at least one signal processor configured to: generate an angle signal including an angular value corresponding to an orientation of a magnetic field based on the first sensor signal and the second sensor signal; generate a vector length signal comprising a plurality of vector lengths corresponding to the first sensor signal and the second sensor signal; determine a vector length variance between at least two consecutively sampled vector lengths of the plurality of vector lengths; compare the determined vector length variance to a tolerance range defined by at least one of a minimum tolerance threshold and a maximum tolerance threshold; and generate a warning signal on a condition that the determined vector length variance is outside the tolerance range.

20 Claims, 5 Drawing Sheets

VECTOR LENGTH VARIANCE CHECK FOR FUNCTIONAL SAFETY OF ANGLE SENSORS

FIELD

The present disclosure relates generally to magnetic field angle sensors, and, more particularly, to performing functional safety checks on magnetic field angle sensors.

BACKGROUND

Today, vehicles feature numerous safety, body, and powertrain applications that rely on magnetic position and angle sensors. A magnetic angle sensor may be used to detect a rotational position or movement of a shaft or other rotatable object. For example, in Electric Power Steering (EPS), magnetic angle sensors can be used to measure steering angle and steering torque for steering wheel sensing. Modern powertrain systems can rely on magnetic angle sensors for camshaft, crankshaft, and transmission applications.

In addition, functional safety of electronic systems in automotive passenger cars is an important topic in the light of increasing automation and semiconductor content of modern cars. It is desirable to have a reliable and safe functionality for the safety critical parts deployed in the system.

One requirement, which may often exist in such safety-critical applications, is that malfunctions of a sensor device have to be detectable by the system, for example by an entity receiving signals from the sensor device. In other words, according to such a requirement it has to be possible to detect, if a sensor device delivers erroneous values, e.g., due to a fault of the sensor device.

Monitoring a vector length is known as an effective safety mechanism for magnetic field angle sensors. However, its diagnostic coverage heavily depends on the sensor technology and the compensation of environmental and device influences, such as temperature, stress, age, etc.

Thus, a device that is configured to verify the functionality of an angle sensor may be desirable. It may be further desirable to perform the verification while taking into account environmental and device influences.

SUMMARY

One or more embodiments are directed to a performing a vector length variance check on angel sensors for enhancing functional safety of the angle sensor.

One or more embodiments provide magnetic angle sensor that includes a first magnetic sensor configured to generate a first sensor signal in response to a first component of a magnetic field; a second magnetic sensor configured to generate a second sensor signal in response to a second component of the magnetic field; and at least one signal processor. The at least one signal processor is configured to: generate an angle signal including an angular value corresponding to an orientation of the magnetic field based on the first sensor signal and the second sensor signal; generate a vector length signal comprising a plurality of vector lengths corresponding to the first sensor signal and the second sensor signal based on the first sensor signal and the second sensor signal, where each of the plurality of vector lengths is sampled at a different sample time of a plurality of consecutive sample times; determine a vector length variance between at least two consecutively sampled vector lengths of the plurality of vector lengths; compare the determined vector length variance to a tolerance range defined by at least one of a minimum tolerance threshold and a maximum tolerance threshold; and generate a warning signal on a condition that the determined vector length variance is outside the tolerance range.

One or more further embodiments provide magnetic angle sensor that includes a first magnetic sensor configured to generate a first sensor signal in response to a first component of a magnetic field; a second magnetic sensor configured to generate a second sensor signal in response to a second component of the magnetic field; and at least one signal processor. The at least one signal processor is configured to: generate an angle signal including an angular value corresponding to an orientation of the magnetic field based on the first sensor signal and the second sensor signal; generate a vector length signal comprising a plurality of vector lengths corresponding to the first sensor signal and the second sensor signal based on the first sensor signal and the second sensor signal, where each of the plurality of vector lengths is sampled at a different sample time of a plurality of consecutive sample times; extract at least one spectral component of the vector length signal, the at least one spectral component being indicative of a vector length variance between at least two consecutively sampled vector lengths of the plurality of vector lengths; and generate a warning signal on a condition that the at least one extracted spectral component is outside a tolerance range.

One or more further embodiments provide a method of performing a vector length variance check. The method includes generating a first sensor signal in response to a first component of a magnetic field; generating a second sensor signal in response to a second component of the magnetic field; generating an angle signal including an angular value corresponding to an orientation of the magnetic field based on the first sensor signal and the second sensor signal; generating a vector length signal comprising a plurality of vector lengths corresponding to the first sensor signal and the second sensor signal based on the first sensor signal and the second sensor signal, where each of the plurality of vector lengths is sampled at a different sample time of a plurality of consecutive sample times; determining a vector length variance between at least two consecutively sampled vector lengths of the plurality of vector lengths; comparing the determined vector length variance to a tolerance range defined by at least one of a minimum tolerance threshold and a maximum tolerance threshold; and generating a warning signal on a condition that the determined vector length variance is outside the tolerance range.

One or more further embodiments provide a method of performing a vector length variance check. The method includes generating a first sensor signal in response to a first component of a magnetic field; generating a second sensor signal in response to a second component of the magnetic field; generating an angle signal including an angular value corresponding to an orientation of the magnetic field based on the first sensor signal and the second sensor signal; generating a vector length signal comprising a plurality of vector lengths corresponding to the first sensor signal and the second sensor signal based on the first sensor signal and the second sensor signal, where each of the plurality of vector lengths is sampled at a different sample time of a plurality of consecutive sample times; extracting at least one frequency component of the vector length signal, the at least one frequency component being indicative of a vector length variance between at least two consecutively sampled vector lengths of the plurality of vector lengths; and generating a warning signal on a condition that the at least one extracted frequency component is outside a tolerance range.

BRIEF DESCRIPTION OF THE DRAWINGS

Embodiments are described herein making reference to the appended drawings.

DETAILED DESCRIPTION

Figure 1:
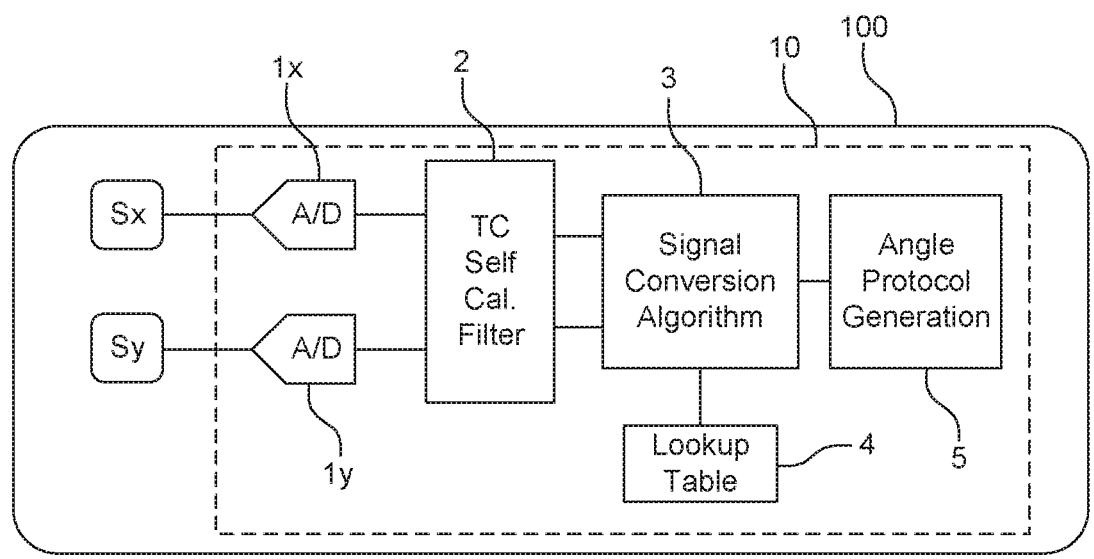
FIG. 1 is a block diagram illustrating a magnetic angle sensor according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto.

A magnetic field sensor, for example, includes one or more magnetic field sensing elements that measure one or more characteristics of a magnetic field (e.g., an amount of magnetic field flux density, a field strength, a field angle, a field direction, a field orientation, etc.). The magnetic field may be produced by a magnet, a current-carrying conductor (e.g., a wire), the Earth, or other magnetic field source. Each magnetic field sensing element is configured to generate a sensor signal (e.g., a voltage signal) in response to one or more magnetic fields impinging on the sensing element. Thus, a sensor signal is indicative of the magnitude and/or the orientation of the magnetic field impinging on the sensing element.

It will be appreciated that the terms "sensor" and "sensing element" may be used interchangeably throughout this description, and the terms "sensor signal" and "measurement signal" may be used interchangeably throughout this description.

Magnetic sensors provided in the described embodiments may include one or more magnetoresistive sensing elements, which are comprised of a magnetoresistive material (e.g., nickel-iron (NiFe)), where the electrical resistance of the magnetoresistive material may depend on a strength and/or a direction of the magnetic field present at the magnetoresistive material. Here, a sensing element may operate based on an anisotropic magnetoresistance (AMR) effect, a giant magnetoresistance (GMR) effect, a tunnel magnetoresistance (TMR) effect, or the like. As another example, a magnetic sensor may include one or more Hall-based sensing elements that operate based on a Hall-effect. A magnetic angle sensor may include multiple sensing elements of one or more types.

As an additional example, resolver coils may be used as magnetic sensors. However, it should be understood that the induced voltages of the resolver coils have to be demodulated before they can be used as x and y components for the calculation of the angle and the vector length.

A magnetic field component may be, for example, an x-magnetic field component (Bx), a y-magnetic field component (By), or a z-magnetic field component (Bz), where the Bx and By field components are in-plane to the chip, and Bz is out-of-plane to the chip in the examples provided. A sensing element may be sensitive to one component of the magnetic field according to its "sensitivity-axis" or "sensing axis".

For example, measurement values (e.g., voltage) output by a sensing element changes according to the magnetic field strength in the direction of its sensing axis. For example, a sensing element that has its sensitivity-axis aligned with an x-axis is sensitive to x-magnetic field component (Bx), whereas a sensing element that has its sensitivity-axis aligned with a y-axis is sensitive to y-magnetic field component (By). Thus, two sensing elements may be configured to have their sensitivity-axes arranged orthogonal to each other.

According to one or more embodiments, a plurality of magnetic field angle sensors and a sensor circuitry may be both accommodated (i.e., integrated) in the same chip. The sensor circuit may be referred to as a signal processing circuit and/or a signal conditioning circuit that receives one or more signals (i.e., sensor signals) from one or more magnetic field sensing elements in the form of raw measurement data and derives, from the sensor signal, a measurement signal that represents the magnetic field.

In some cases, a measurement signal may be differential measurement signal that is derived from sensor signals generated by two sensing elements having a same sensing axis (e.g., two sensing elements sensitive to the same magnetic field component) using differential calculus. A differential measurement signal provides robustness to homogenous external stray magnetic fields.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

Thus, the sensor circuit may include an analog-to-digital converter (ADC) that converts the analog signal from the one or more sensing elements to a digital signal. The sensor circuit may also include a digital signal processor (DSP) that performs some processing on the digital signal, to be discussed below. Therefore, a chip, which may also be referred to as an integrated circuit (IC), may include a circuit that conditions and amplifies the small signal of one or more magnetic field sensing elements via signal processing and/or conditioning. It will also be appreciated that the described embodiments may be divided onto two or more chips. In addition, the sensor circuit may include an optional demodulator that demodulates the x and y components for the case that the measurement is done with an alternating magnetic field as it is done in a resolver. The demodulation can be done in the analog domain, before the ADC, or in the digital domain via a DSP, after the A/D conversion.

A sensor device, as used herein, may refer to a device which includes a sensor and sensor circuit as described above.

FIG. 1 is a block diagram illustrating a magnetic angle sensor 100 according to one or more embodiments. The magnetic angle sensor 100 may include two sensing elements Sx and Sy that are arranged to provide output signals corresponding to two orthogonal components of a magnetic field, such as an x-component of the magnetic field and a y-component of the magnetic field. In this case, the sensing element Sx is configured to sense a sine angle component (e.g., x-component) of the magnetic field and the sensing element Sy is configured to sense a cosine angle component (e.g., y-component) of the magnetic field. Thus, the two sensing elements Sx and Sy are configured to generate two sensor signals (e.g., a voltage signal Vx and a voltage signal Vy) that are phase shifted from each other by 90°.

The magnetic angle sensor 100 also includes a sensor circuit 10 that receives the sensor signals from the sensing elements Sx and Sy for processing and for generation of an angle output signal corresponding to an orientation of the magnetic field. The sensor circuit 10 includes two signal paths: an X signal path and a Y signal path. The signal-X on the X signal path may be in a form of a sinusoidal (sine) waveform that represents an angular orientation of the target object, and the signal-Y on the Y signal path may be a similar waveform that is shifted 90° from signal-X. That is, signal-Y is a sinusoidal (cosine) waveform that represents an angular orientation of the target object. It will be appreciated that while the examples herein describe the sine waveform as being used as signal-X and the cosine waveform as being used as signal-Y, the opposite may also be true so long as the two signals are phase shifted 90° from each other.

Signal paths X and Y may include an ADC 1x and an ADC 1y, respectively, that convert the sensor signal Vx and Vy of the respective signal path into a digital signal for further processing by a remaining portion of the sensor circuit 10.

A DSP may include a digital signal processing device or a collection of digital signal processing devices. The DSP may receive digital signals from the ADCs 1x and 1y and may process the digital signals to form output signals destined for an external device, such as a controller (not illustrated). Each "block" may include one or more processors for processing one or more signals.

The DSP may include a temperature compensation (TC), self-calibration, and filter block 2, a signal conversion algorithm block 3, an optional memory element 4, and an angle protocol block 5.

The temperature compensation (TC), self-calibration, and filter block 2 may receive the sensor signals Vx and Vy and a temperature sensor signal T, and perform one or more signal conditioning operations thereon before outputting the compensated sensor signals Vx and Vy to the signal conversion algorithm block 3. The temperature compensation (TC), self-calibration, and filter block 2 may be considered optional in some applications.

The signal conversion algorithm block 3 is configured to receive the compensated sensor signals Vx and Vy for further processing. For example, the signal conversion algorithm block 3 may include one or more processors and/or logic units that performs various signal conditioning functions, such as absolute signal conversion, normalization, linearization, self-testing, and so forth. One or more signal conditioning functions may be performed in combination with a lookup table stored in the memory element 4. In other words, the signal conversion algorithm block 3 receives the sensor signals Vx and Vy from the sensing elements Sx and Sy, and converts the sensor signals into measurement signals (i.e., measurement values) Vx' and Vy' that is to be used for further calculations, such as angle calculations and vector length calculations.

Optional memory element 4 may include a read only memory (ROM) (e.g., an EEPROM), a random access memory (RAM), and/or another type of dynamic or static storage device (e.g., a flash memory, a magnetic memory, an optical memory, etc.) that stores information and/or instructions for use by the signal conversion algorithm block 3. In some implementations, optional memory element 4 may store information associated with processing performed by the signal conversion algorithm block 3. Additionally, or alternatively, optional memory element 4 may store configurational values or parameters for the set of sensing elements Sx and Sy and/or information for one or more other elements of the angle sensor 100, such as ADCs 1x and 1y.

Thus, the temperature compensation (TC), self-calibration, and filter block 2 and the signal conversion algorithm block 3, convert the sensor signals Vx and Vy into measurement signals Vx' and Vy'. The output of the signal conversion algorithm block 3 Vx' and Vy' is provided to an angle protocol block 5 that is configured to generate an angle signal as an output signal based on measurement signals Vx' and Vy'. The angle protocol block 5 may be a processor that is configured to apply an angle algorithm (e.g., α=arctan (Vy/Vx)) for determining the angle of a rotating magnetic field, and generate the angle signal that represents an angular value.

Ultimately, the angle protocol block 5 is configured to receive the sensor signals Vx and Vy or measurement signals derived therefrom (e.g., compensated voltage signal Vx' and compensated voltage signal Vy'). The angle protocol block 5 is configured to calculate an angle of rotation (α) of a magnet that generates the magnetic field (and an angle of rotation of a rotatable object to which the magnet is connected) based on the sensor signals or measurement signals corresponding to the two orthogonal components (e.g., α=arctan(Vy/Vx)).

In some cases, a functional safety check may be implemented in the angle sensor 100. For example, a vector length associated with the sensor signals (e.g., a vector length (VL) equal to $Vx^2+Vy^2$) may be monitored during operation of the angle sensor as a functional safety check. In one example, if the vector length remains substantially constant during operation of the angle sensor (e.g., after calibration and/or temperature compensation), then safe operation of the angle sensor may be assumed. However, such a functional safety check (e.g., based on two output signals) has limited accuracy and/or may have insufficient diagnostic coverage due to being dependent on absolute values of the output signals.

In addition, besides the monitoring of the absolute vector length, the invention monitors the change of the vector length. This has the advantage that there is only a very narrow range between vector length values must be tolerated, since ambient influences like temperature or mechanical stress changes very slow.

Figure 2A:
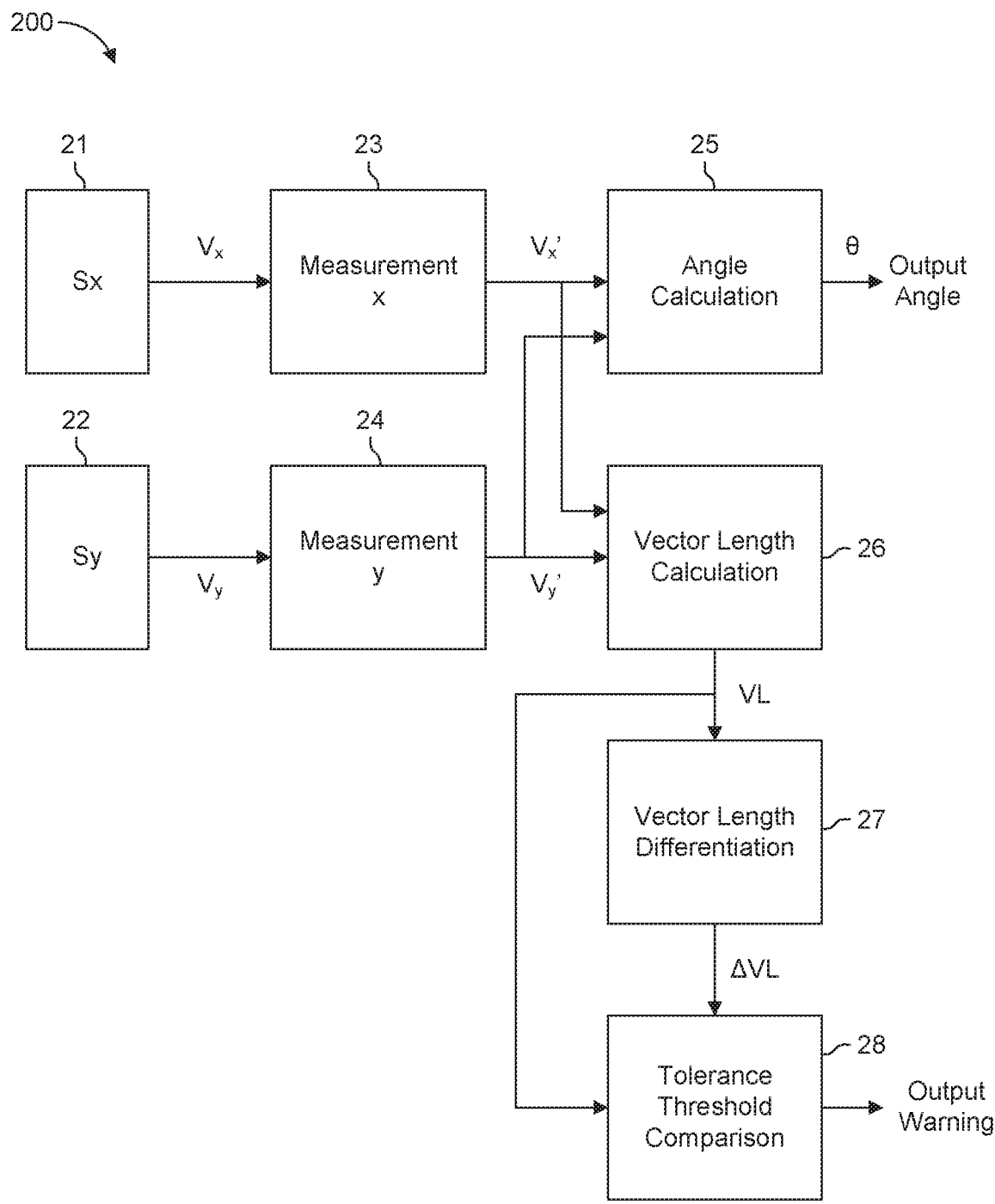
FIG. 2A is a schematic block diagram of a magnetic angle sensor device according to one or more embodiments.

FIG. 2A is a schematic block diagram of a magnetic angle sensor device 200 according to one or more embodiments. The magnetic angle sensor device 200 is a system that may be integrated on one or more chips. The magnetic angle sensor device 200 includes several signal processing circuits and blocks configured to process sensor signals and measurement signals that, as a whole, make up a sensor circuit. It will be appreciated that the signal processing circuits and blocks may be combined into a single processor, microprocessor, DSP, and the like. Alternatively, the signal processing circuits and blocks may be provided in two or more processors, microprocessors, DSPs, and the like. The one or more signal processing circuits and blocks can be integrated on a sensor chip along with the sensing elements or be provided in a microcontroller on system level.

Figure 2B:
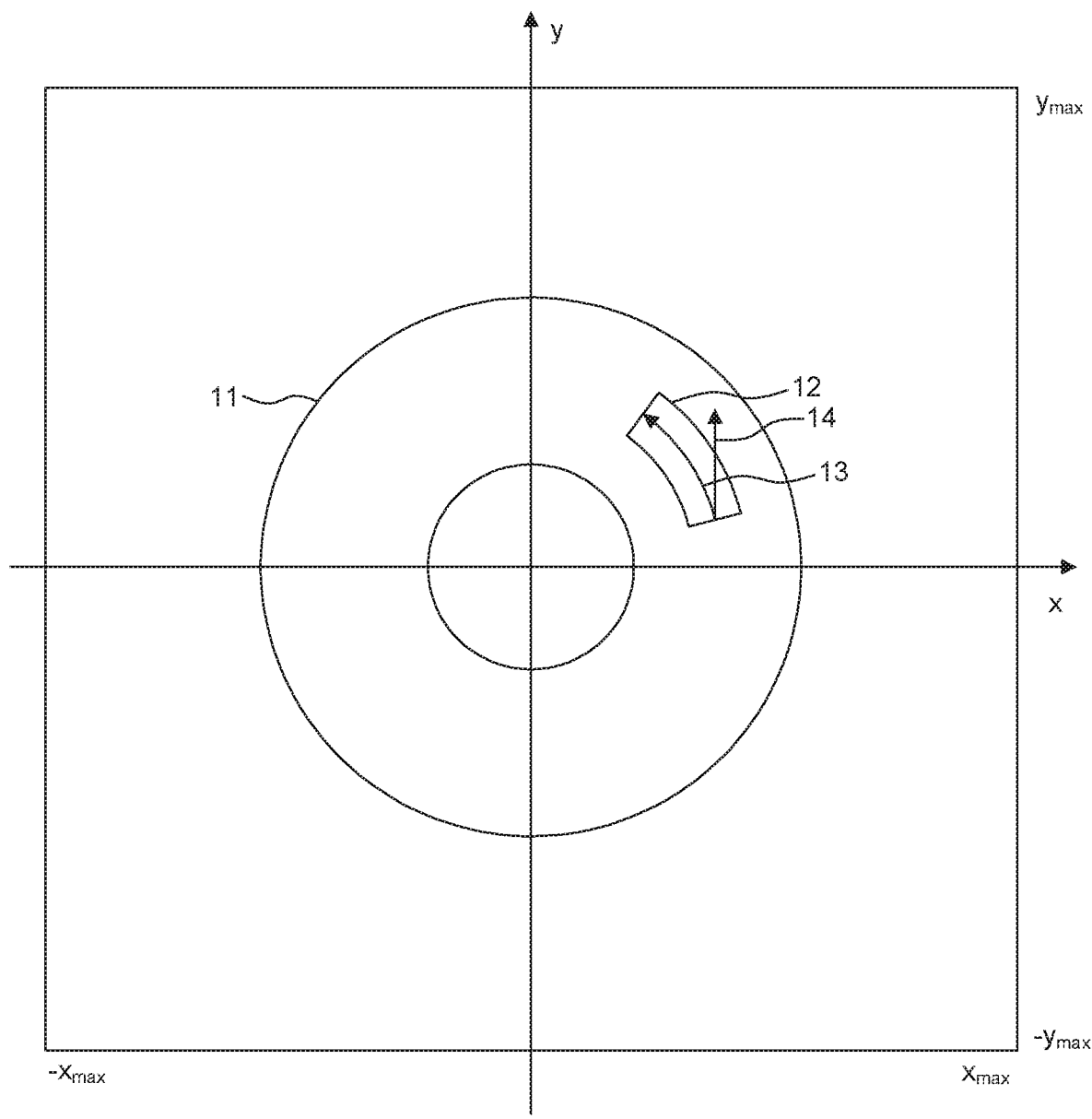
FIG. 2B is a graph illustrating a vector length tolerance region according to one or more embodiments.

FIG. 2B is a graph illustrating a vector length tolerance region according to one or more embodiments. In particular, a vector length is plotted according to the equation $VL=Vx^2+Vy^2$. The graph illustrates a vector length plotted in x-y coordinates (i.e., based on the two sensed x and y magnetic field components), where +/−Ymax represent extrema of a y ADC conversion range and +/−Xmax represent extrema of an x ADC conversion range. Ideally, the length vector should track a circle, but some degree of tolerance is used to account for non-idealities.

The graph illustrates a wide vector length tolerance region 11 and a narrow vector length tolerance region 12. The graph further illustrates a normal length vector 13 with a changing angle and a faulty vector 14, which is "stuck" at an x-value. Since x and y components are constantly changing with a rotating magnetic field, the faulty length vector 14 stuck at an x-value indicates that the sensed x-component is no longer changing. This may be an indication that the sensing element Sx is faulty.

The graph demonstrates that the changing normal length vector 13 remained within the narrow vector length tolerance region 12, indicating normal operation. In contrast, the faulty length vector 14 goes outside the bounds of the narrow vector length tolerance region 12, indicating faulty behavior.

Turning back to FIG. 2A, the magnetic angle sensor device 200 includes a first sensing element (Sx) 21 and a second sensing element (Sx) 22 that generate sensor signals Vx and Vy, as described above.

The magnetic angle sensor device 200 also includes a first measurement circuit 23 and a second measurement circuit 24 that generate measurement signals Vx' and Vy', respectively, as described above.

The measurement circuits 23 and 24 may each include an ADC (e.g., ADC 1x or ADC 1y) a temperature compensation (TC), self-calibration, and filter block 2, a signal conversion algorithm block 3, and a memory element 4. Thus, the measurement circuits 23 and 24 each includes one or more processors and/or logic units that performs various signal conditioning functions in order to derive the measurement values Vx' and Vy' from the sensor signals Vx and Vy for use in further calculations. The measurement circuits 23 and 24 may be a microprocessor, such as a DSP, or a portion thereof.

The magnetic angle sensor device 200 further includes an angle protocol block 25 configured to process the measurement values Vx' and Vy' to generate an angle signal θ as an output angle according to an angle algorithm (e.g., α=arctan (Vy'/Vx'). The angle protocol block 25 may be configured to generate and output an angle measurement at different sample times.

The magnetic angle sensor device 200 further includes a vector length protocol block 26 configured to process the measurement values Vx' and Vy' to generate a vector length signal as an output vector length according to a vector length algorithm (e.g., $VL=Vx'^2+Vy'^2$). The vector length protocol block 26 is configured to generate and output a vector length measurement VL at different sample times, which may coincide with the different sample times of the angle measurements. Thus, each vector length measurement VL may also correspond to an angle measurement.

The magnetic angle sensor device 200 further includes a vector length differentiation block 27 configured to calculate a vector length difference between at least two vector length (VL) samples.

In one implementation, the vector length differentiation block 27 is configured to receive two adjacent VL samples (i.e., two samples taken at two consecutive sample times), and calculate a difference therebetween to generate a differential vector length (e.g., ΔVL=VL1−VL2).

Since the sampling rate of the angle measurements is high, the vector length check may not rely on only one measurement of the vector length change. Thus, other implementations that use more than two adjacent samples is also possible, which may vary in implementation based on the set of measured vector length changes criteria.

For example, in another implementation, the vector length differentiation block 27 is configured to receive two or more adjacent VL samples (i.e., two or more samples taken at consecutive sample times), calculate a differential vector length (ΔVL) between each pair of adjacent VL samples to generate a set of differential vector length values, and further calculate an average of the differential vector lengths ($ΔVL_{avg1}$) at its output.

In another implementation, the vector length differentiation block 27 is configured to receive two or more adjacent VL samples (i.e., two or more samples taken at consecutive sample times), calculate a differential vector length (ΔVL) between each pair of adjacent VL samples to generate a set of differential vector length values, determine a differential vector length minimum value (ΔVLmin) among the set of differential vector length values, determine a differential vector length maximum value (ΔVLmax) among the set of differential vector length values, and output the minimum value (ΔVLmin) and the maximum value (ΔVLmax) at its output as differential vector lengths to be evaluated.

In another implementation, the vector length differentiation block 27 is configured to receive two or more adjacent VL samples (i.e., two or more samples taken at consecutive sample times), capture minimum and maximum values among the vector length samples, and calculate $\Delta VLmm = VLmax - VLmin$ as the differential vector length.

In another implementation, the vector length differentiation block 27 is configured to receive two or more adjacent VL samples (i.e., two or more samples taken at consecutive sample times), calculate a standard deviation (stdev) of the adjacent VL samples as the differential vector length $\Delta VL_{SD}$ to be evaluated.

The magnetic angle sensor device 200 further includes a vector length variance analysis block 28 configured to receive the outputs from the vector length differentiation block 27 (e.g., $\Delta VL$, $\Delta VL_{avg1}$, $\Delta VLmin$, $\Delta VLmax$, $\Delta VLmm$, and/or $\Delta VL_{SD}$) and perform a variance analysis check on the received information based on one or more predetermined tolerance thresholds. If a differential value exceeds predetermined tolerance threshold, the vector length variance analysis block 28 may generate a warning signal indicative of a fault in the angle sensor device 200 and output the warning signal to an external device, such as an external controller.

For example, vector length variance analysis block 28 may receive the differential vector length ($\Delta VL$), and compare the differential vector length ($\Delta VL$) to a minimum tolerance threshold value and a maximum tolerance threshold value. One or both of the minimum tolerance threshold value and the maximum tolerance threshold value may define a tolerance range or window in which the differential vector lengths are acceptable and indicate normal functionality.

Thus, if the differential vector length ($\Delta VL$) is less than the minimum tolerance threshold value or greater than the maximum tolerance threshold value, the vector length variance analysis block 28 determines that the differential vector length ($\Delta VL$) is outside of the boundaries of the tolerance range and that a fault may exists within the magnetic angle sensor device 200.

On the other hand, if the if the differential vector length ($\Delta VL$) is equal to or greater than the minimum tolerance threshold value and equal to or less than the maximum tolerance threshold value, the vector length variance analysis block 28 determines that the differential vector length ($\Delta VL$) is within the boundaries of the tolerance range and that the magnetic angle sensor device 200 is operating within an acceptable margin of error (i.e., the magnetic angle sensor device 200 is operating normally). If the differential vector length ($\Delta VL$) is within the boundaries of the tolerance range, the vector length variance analysis block 28 determines not to generate a warning signal.

The vector length variance analysis block 28 performs a similar evaluation for $\Delta VL_{avg1}$, $\Delta VLmm$, $\Delta VLmin$, $\Delta VLmax$, and $\Delta VL_{SD}$, where each delta value output by the vector length differentiation block 27 is evaluated by a minimum tolerance threshold value and a maximum tolerance threshold value. Different minimum and maximum tolerance threshold values may be used depending on the type of delta variable is being evaluated. The delta variables $\Delta VLmin$ and $\Delta VLmax$ may be evaluated according to a same set of minimum and maximum tolerance threshold values (i.e., via one tolerance range).

Alternatively, the vector length variance analysis block 28 may calculate the absolute value (abs) of the differential vector lengths ($\Delta VL$), determine one or more of the delta values based on the absolute value of the differential vector lengths ($\Delta VL$), and monitor the delta value based on the maximum tolerance threshold value.

For example, the vector length variance analysis block 28 may use the absolute value of a differential vector length ($\Delta VL$), representing a difference between the first vector length and the second vector length as the vector length variance, and compare the vector length variance to the maximum tolerance threshold value. If the absolute value of a differential vector length ($\Delta VL$) exceeds the maximum tolerance threshold value, the vector length differentiation block 27 generates a warning signal.

Alternatively, the vector length variance analysis block 28 may calculate a plurality of differential vector lengths, each corresponding to a different one of the plurality of pairs of consecutively sampled vector lengths and each representing a difference between a first vector length and a second vector length of its corresponding pair of consecutively sampled vector lengths, calculate a plurality of absolute values, each being an absolute value of one of the plurality of differential vector lengths, and calculate an average value of the plurality of absolute values as the vector length variance.

Alternatively, the vector length variance analysis block 28 may calculate a plurality of differential vector lengths, each corresponding to a different one of the plurality of pairs of consecutively sampled vector lengths and each representing a difference between a first vector length and a second vector length of its corresponding pair of consecutively sampled vector lengths, calculate a plurality of absolute values, each being an absolute value of one of the plurality of differential vector lengths, and determine at least one of a minimum absolute value having a smallest value among the plurality of absolute values or a maximum absolute value having a largest value among the plurality of absolute values as the vector length variance.

Here, the vector length variance analysis block 28 may determine the minimum absolute value of the plurality of absolute values as a first vector length variance, determine the maximum absolute value of the plurality of absolute values as a second vector length variance, compare the minimum absolute value to the tolerance range, compare the maximum absolute value to the tolerance range, and generate the warning signal on a condition that at least one of the first vector length variance or the second vector length variance is outside the tolerance range. Here, when the maximum absolute value is outside of the tolerance range, it means that one of the delta samples was too large. On the other and, when the minimum absolute value is outside of the tolerance range, it means that all delta samples were too large.

The vector length differentiation block 27 may be configured to change the type of delta variable it calculates and outputs to the vector length variance analysis block 28. As a result, the vector length variance analysis block 28 may include a memory element that stores a look-up table that includes different sets of minimum and maximum tolerance threshold values (i.e., different sets of tolerance ranges) mapped to different types of delta variables, and may be configured to select a set of minimum and maximum tolerance threshold values from the look-up table based on the type of delta variable received.

In addition, the vector length variance analysis block 28 may monitor the absolute vector length based on the vector length measurements VL in addition to monitoring the change of the vector length. To do so, the vector length protocol block 26 and the vector length variance analysis block 28 may be coupled together such that the vector length protocol block 26 provides the vector length signal comprising vector length measurements VL to the vector length variance analysis block 28.

Figure 3:
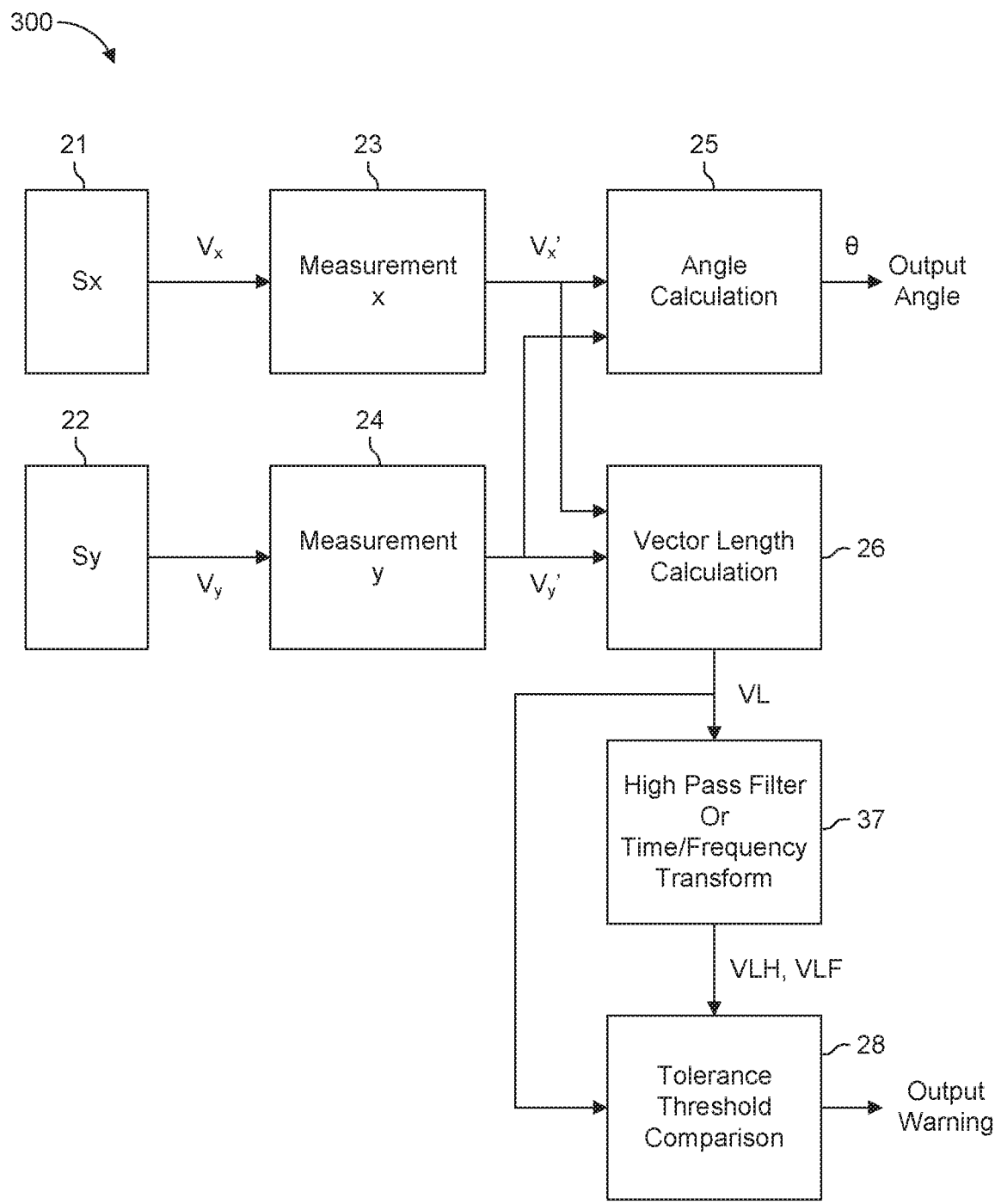
FIG. 3 is a schematic block diagram of another magnetic angle sensor device according to one or more embodiments.

FIG. 3 is a schematic block diagram of a magnetic angle sensor device 300 according to one or more embodiments. The magnetic angle sensor device 300 is a system that may be integrated on one or more chips. The magnetic angle sensor device 300 includes several signal processing circuits and blocks configured to process sensor signals and measurement signals that, as a whole, make up a sensor circuit. It will be appreciated that the signal processing circuits and blocks may be combined into a single processor, microprocessor, DSP, and the like. Alternatively, the signal processing circuits and blocks may be provided in two or more processors, microprocessors, DSPs, and the like.

The magnetic angle sensor device 300 is similar to magnetic angle sensor device 200, with the exception that the magnetic angle sensor device 300 includes a vector length processing block 37 instead of vector length differentiation block 27. The vector length processing block 37 may include a high pass filter (HPF), a band pass filter (BPF), a low pass filter (LPF), or a time/frequency transform (i.e., a fast Fourier transform (FFT)). Thus, in the alternative to a differentiation as used in FIG. 2, the criterion for detecting faults in the vector length can also be defined on (1) a high pass/band pass/low pass filtering or (2) a spectral analysis of the vector length samples, where the non-DC spectral components that depend on the vector length variance are monitored. The HPF, BPF, and LPF may employ finite impulse response (FIR) filtering or infinite impulse response (IIR) filtering.

For example, two or more vector lengths (VL) may be received by the vector length processing block 37 in the form of a vector length signal, the frequency of which changes based on the variance between vector length samples. For example, the greater the variance, the greater the amplitude of the HPF output VLH. It is noted that the energy level of non-DC spectral components of the vector length signal also increases as the variance between vector length samples increases, or decreases as the variance between vector length samples decreases. As a result, the HPF output VLH can be evaluated in the same way as the ΔVL values. For example, the vector length variance analysis block 28 may detect if the amplitude of the HPF output VLH exceeds a threshold either in a positive or a negative direction (i.e., whether the amplitude of the HPF output VLH is outside a tolerance range).

If the vector length processing block 37 includes a high pass filter, then the high frequency components of the vector length signal are passed on to the vector length variance analysis block 28. This occurs when the vector length variance is large enough to produce frequency components that are greater than the cutoff frequency of the high pass filter. Thus, the high frequency signal VLH is output by the vector length processing block 37 to the vector length variance analysis block 28 for analysis.

The cutoff frequency of the high pass filter may be set to a corresponding vector length variance, such that when a differential vector length (ΔVL) is within a tolerance range, the vector length signal is attenuated by the high pass filter. On the other hand, when the differential vector length (ΔVL) is outside a tolerance range, the vector length signal is passed through by the high pass filter. If the vector length variance analysis block 28 receives the high frequency signal VLH, which is deterministic of the differential vector length (ΔVL) being outside the tolerance range, the vector length variance analysis block 28 determines that the variance of the vector length exceeds normal operating conditions and generates a warning signal. If the vector length variance analysis block 28 does not receive the high frequency signal VLH, no warning signal is generated.

In addition to the high frequency signal VLH, the vector length variance analysis block 28 also receives the vector length samples (VL) from the vector length protocol block 26, as described above.

If the vector length processing block 37 includes a band pass filter, then the band-passed frequency components of the vector length signal are passed on to the vector length variance analysis block 28. This occurs when the vector length variance produces frequency components that are within the band of the band pass filter. Thus, band-passed signal is output by the vector length processing block 37 to the vector length variance analysis block 28 for analysis.

If the vector length processing block 37 includes a time/frequency transform, the vector length processing block 37 converts the vector length signal (continuous-time signal), for example, via Discrete Fourier Transform (DFT), into the frequency domain representation of the vector length signal, and outputs the frequency domain representation VLF to the vector length variance analysis block 28 for further analysis.

The greater the variance in vector length samples, the higher the FFT coefficients of the non-DC spectral components will be. Thus, there will be non-DC spectral components in the frequency domain representation that have a high energy. Conversely, the lower the variance in vector length samples, the more likely there will be non-DC spectral components in the frequency domain representation that have a low energy. The vector length variance analysis block 28 is configured to analyze the energy levels of the non-DC spectral components and determine whether any non-DC spectral components are outside a tolerance range. For example, the vector length variance analysis block 28 may be configured to compare the energy levels of the non-DC spectral components to minimum and maximum energy levels that define a tolerance range, and generate a warning signal if one or more energy levels is determined to be outside the tolerance range.

In particular, vector length processing block 37 converts the vector length signal from a time domain into a frequency domain via a DFT algorithm to generate a frequency domain vector length signal comprising the at least one extracted spectral component. Usually, a relatively wide range of frequency components will be extracted. The vector length processing block 37 may calculate a sum or weighted sum of the magnitude of the at least one extracted spectral component, compare the sum or the weighted sum to the tolerance range, and generate the warning signal on a condition that the sum or the weighted sum is outside the tolerance range.

In addition to the frequency domain representation VLF, the vector length variance analysis block 28 also receives the vector length samples (VL) from the vector length protocol block 26, as described above.

Figure 4:
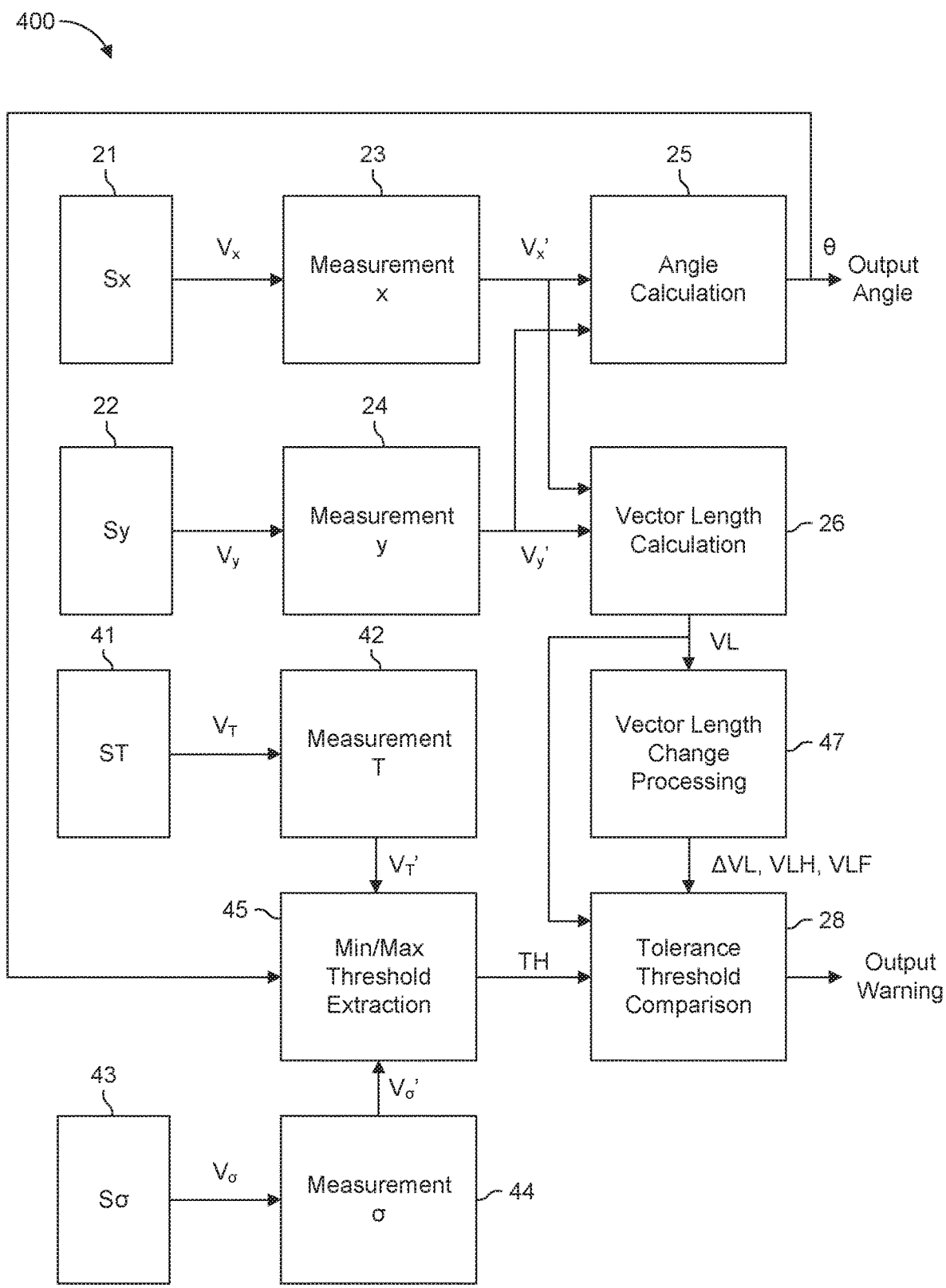
FIG. 4 is a schematic block diagram of another magnetic angle sensor device according to one or more embodiments.

FIG. 4 is a schematic block diagram of a magnetic angle sensor device 400 according to one or more embodiments. The magnetic angle sensor device 300 is a system that may be integrated on one or more chips. The magnetic angle sensor device 400 includes several signal processing circuits and blocks configured to process sensor signals and measurement signals that, as a whole, make up a sensor circuit. It will be appreciated that the signal processing circuits and blocks may be combined into a single processor, microprocessor, DSP, and the like. Alternatively, the signal processing circuits and blocks may be provided in two or more processors, microprocessors, DSPs, and the like.

The magnetic angle sensor device 400 is similar to the magnetic angle sensor devices 200 and 300 in that it includes sensing elements 21 and 22, measurement circuits 23 and 24, angle protocol block 25, and a vector length protocol block 26. The magnetic angle sensor device 400 further includes a vector length change processing block 47, which can be either the vector length differentiation block 27 or the vector length processing block 37. The magnetic angle sensor device 400 further includes the vector length variance analysis block 28, which may be configured to perform as described in reference to FIG. 2 or to FIG. 3.

The magnetic angle sensor device 400 further includes a temperature sensor (ST) 41 and a temperature measurement circuit 42. The temperature sensor 41 is configured to measure an ambient temperature and generate a sensor signal $V_T$ representative of the measured temperature. The temperature measurement circuit 42 is configured to perform signal processing and conditioning on the sensor signal $V_T$, for example, in a similar manner as described in reference to measurement circuits 23 and 24, and generate a temperature measurement signal $V_T'$.

The temperature measurement circuit 42 may also be configured to calculate a temperature variance between two or more consecutive temperature measurement samples.

The magnetic angle sensor device 400 further includes a stress sensor (Sσ) 43 and a stress measurement circuit 44. The stress sensor 43 is configured to measure a mechanical stress acting on the sensor chip and generate a sensor signal Vσ representative of the measured stress. For example, the stress sensor 43 may be a piezoresistive sensor integrated in a substrate of the sensor chip.

The stress measurement circuit 44 is configured to perform signal processing and conditioning on the sensor signal Vσ, for example, in a similar manner as described in reference to measurement circuits 23 and 24, and generate a stress measurement signal Vσ'.

The stress measurement circuit 44 may also be configured to calculate a stress variance between two or more consecutive stress measurement samples.

For the temperature and the die stress measurements, the sampling rates FS_T and FS_stress, respectively, can be lower than the sampling rate for the angle FS_angle, since temperature and stress are slow changing properties. Thus, FS_T<=FS_angle and FS_stress<=FS_angle.

The angle protocol block 25 may also be configured to calculate an angle variance between two or more consecutive angle measurement samples. The angle sampling rate or frequency may be equal to or greater than the sampling rate or frequency of the vector length calculation performed by the vector length protocol block 26. In other words, the sampling rate of the vector length FS_VL implemented by the vector length protocol block 26 is typically equal to the sampling rate of the angle measurement FS_angle implemented by the angle protocol block 25, but may be less than the sampling rate FS_angle if, for example, computing power is limited (i.e., FS_VL<=FS_angle). If the sampling frequency for the angle measurements is greater than the sampling frequency for the vector length calculation, a transfer function may be used that approximates the vector length variance function over the same time window based on the lower number of available samples.

If the variance method is a standard deviation stdev, the vector length processing block 27 will use the average of a group of samples (N) that are taken into account for the standard deviation and consequently the sampling rate of the standard deviation will be FS_stdev=FS_VL/N, where N is an integer greater than 1.

If differences between consecutive vector lengths are used, each variance sample delivers a difference to the previous one. In this case, the sampling rate of the vector length difference FS_VLdiff will equal FS_VL.

In case variance measurements that employ filters, as in FIG. 3, realization can be found with or without decimations (D). Thus, the sampling rate of the variance measurements FS_variance_Filter=FS_VL or FS_variance_Filter=FS_VL/D, where the sampling is performed by the length variance analysis block 28. In general, it can be said that the sampling rate of the vector length variance FS_variance<=FS_VL.

Analogous to the variance for the VL, the variance for stress and temperature can be FS_variance_T<=FS_T or FS_variance_stress<=FS_stress. If the sampling rate for a temperature or a stress or their respective variances is lower than the sampling rate for the VL variance, it might be interpolated or in this case better said extrapolated to the sampling time of the actual VL_variance sample. In other words, if the sampling rate for a temperature or a stress or their respective variances is lower than the sampling rate for the VL variance, a transfer function may be used that approximates the vector length variance function over the same time window based on the lower number of available samples.

The magnetic angle sensor device 400 further includes min/max threshold determination block 46 that is configured to select or extract a minimum tolerance threshold from a plurality of different minimum tolerance thresholds and select or extract a maximum tolerance threshold from a plurality of different maximum tolerance thresholds.

In particular, the min/max threshold determination block 46 may be configured to receive the temperature measurement signal $V_T'$ or a temperature variance measurement and select the minimum tolerance threshold and the maximum tolerance threshold based on the measured temperature value or the temperature variance measurement value. The selected minimum tolerance threshold and the maximum tolerance threshold may be extracted from a look-up table that stores minimum tolerance thresholds and the maximum tolerance thresholds mapped to different temperature values, different temperature variances, or different temperature ranges.

Alternatively, the VL thresholds may also be updated by the min/max threshold determination block 46 by being scaled with a linear function depending on the variance of the other measurements (temperature, stress, and/or angle). For example, updated threshold=current threshold*(1+scaleT*delta T+scale stress*delta stress+scale angel*delta angel), where the current threshold may be an initial threshold or a previously updated threshold. Additionally, scaleT represents a scaler factor for temperature, scale stress represents a scaler factor for stress, scale angle represents a scaler factor for angle, delta T represents a measured variance in temperature, delta stress represents a measured variance in stress, and delta angle represents a measured variance in angle.

The minimum tolerance threshold and the maximum tolerance threshold may be analyzed and adjusted after each acquired angle sample or angle variance measurement. Thus, the min/max threshold determination block 46 may be further configured to receive angle measurement samples or angle variance samples from the output of the angle protocol block 25.

The tolerance range may be widened or narrowed if the temperature or another environmental parameter changes over the time during which the vector length samples are observed. Here, the minimum tolerance threshold and the maximum tolerance threshold are adjusted in opposite directions to adjust the width of the tolerance range.

The tolerance range may be shifted up or down if the temperature or another environmental parameter changes over the time during which the vector length samples are observed and the sensitivity to this parameter is systematic. Here, the minimum tolerance threshold and the maximum tolerance threshold are adjusted in the same direction to adjust the offset of the tolerance range.

The min/max threshold determination block 46 may then transmit threshold information TH, including the selected minimum tolerance threshold and the selected maximum tolerance threshold, to the vector length variance analysis block 28. The vector length variance analysis block 28 is configured to set its minimum tolerance threshold and the selected maximum tolerance threshold (i.e., its tolerance range) according to the received threshold information TH, and may adjust these thresholds periodically upon receiving updated threshold information TH.

Additionally, or alternatively, the min/max threshold determination block 46 may be configured to receive the stress measurement signal Vσ' or a stress variance measurement and select the minimum tolerance threshold and the maximum tolerance threshold based on the measured stress value or the stress variance measurement value. The selected minimum tolerance threshold and the maximum tolerance threshold may be extracted from a look-up table that stores minimum tolerance thresholds and the maximum tolerance thresholds mapped to different stress values, different stress variances, or different stress ranges, or may be updated by using a linear function (e.g., updated threshold=current threshold*(1+scaleT*delta T+scale stress*delta stress+scale angel*delta angel)).

The min/max threshold determination block 46 may then transmit threshold information TH, including the selected minimum tolerance threshold and the selected maximum tolerance threshold, to the vector length variance analysis block 28. The vector length variance analysis block 28 is configured to set its minimum tolerance threshold and the selected maximum tolerance threshold (i.e., its tolerance range) according to the received threshold information TH, and may adjust these thresholds periodically upon receiving updated threshold information TH.

The minimum tolerance threshold and the maximum tolerance threshold may be analyzed and adjusted after each acquired angle sample or angle variance measurement. Thus, the min/max threshold determination block 46 may be further configured to receive angle measurement samples or angle variance samples from the output of the angle protocol block 25.

The tolerance range may be widened or narrowed if the temperature or another environmental parameter changes over the time during which the vector length samples are observed. Here, the minimum tolerance threshold and the maximum tolerance threshold are adjusted in opposite directions to adjust the width of the tolerance range.

The tolerance range may be shifted up or down if the temperature or another environmental parameter changes over the time during which the vector length samples are observed and the sensitivity to this parameter is systematic. Here, the minimum tolerance threshold and the maximum tolerance threshold are adjusted in the same direction to adjust the offset of the tolerance range.

Additionally, or alternatively, the min/max threshold determination block 46 may be configured to receive the angle measurement samples or angle variance measurement samples from the output of the angle protocol block 25 for determining the minimum tolerance threshold and the maximum tolerance threshold. That is, the trajectory of the rotation vector may not necessarily be an ideal circle due to shorter periodicity effects introduced by, for example, an AMR effect in GMR or TMR devices, exchange coupling between reference and free layer, form anisotropy, crystal anisotropy, etc. As a result, the minimum tolerance threshold and the maximum tolerance threshold may be dependent on the change of the measured angle to take into account the non-ideal circular trajectory of the rotational angle dependence of the magnetic sensor (GMR, AMR, TMR, Hall). Thus, min/max threshold determination block 46 may adjust the minimum tolerance threshold and the maximum tolerance threshold based on the measured angle θ or the measured angle variance between two or more consecutive angle measurements.

Thus, the measured temperature, stress, and angle may be used separately or in any combination to update and adjust the minimum and the maximum tolerance thresholds used by the vector length variance analysis block 28 as environmental and device influences change over time.

Table I provides a summary of variants of the VL variance analysis and their respective use cases. VL change processing corresponds to the processing implemented by the vector length differentiation block 27. Threshold comparison corresponds to the type of threshold comparison analysis implemented by the vector length variance analysis block 28. All other blocks may by implemented independent of the used VL change processing and the used threshold comparison analysis. That is, the vector length differentiation block 27 and the vector length variance analysis block 28 may be adapted according to the desired use case without changing the rest of the system.

TABLE I

| VL change processing | Threshold comparison | Use case |
| --- | --- | --- |
| Difference | min and max | Immediate detection if any sample deviates |
| Difference and averaging Remark: For implementation averaging is replaced by sum and scaled min and max thresholds instead of division by no of samples | min and max | Reduced influence of noise and outliers |
| Difference and LPF (FIR or IIR) Remark: Difference and LPF is one kind of LPF or BPF | min and max | Further reduced influence of noise and outliers depending on LPF order (configurable by LPF corner frequency) |
| HPF (FIR or IIR) | min and max | Reduced influence of noise and outliers (configurable by HPF corner frequency) |
| BPF (FIR or IIR) | min and max | Further reduced influence of noise and outliers depending on BPF order (configurable by both BPF corner frequencies) |
| Absolute of difference | max | Immediate detection if any sample deviates |

TABLE I-continued

| VL change processing | Threshold comparison | Use case |
|---|---|---|
| Absolute of difference and averaging Remark: For implementation averaging is replaced by sum and scaled max thresholds instead of division by no of samples | max | Reduced influence of noise and outliers but better detection of deviations that change direction during observation (typically for angle dependent errors) |
| Absolute of difference and LPF | max | Further reduced influence of noise and outliers depending on LPF order (configurable by LPF corner frequency) but better detection of deviations that change direction during observation (typically for angle dependent errors) |
| Standard deviation (RMS version of absolute difference and average) Remark: For implementation division and sqrt typically omitted by squared and scaled threshold | max | Reduced influence of noise and outliers with increased weight on extremes but better detection of deviations that change direction during observation (typically for angle dependent errors) |
| LPF (FIR or IIR) filtered squared differences as modified approximation of stdev | max | Reduced influence of noise and outliers with increased weight on extremes but configurable by filter corner frequency better detection of deviations that change direction during observation (typically for angle dependent errors) |
| Abs FFT and (weighted) sum of non-DC components | max | Reduced influence of noise and out but configurable by FFT length, sampling frequency and weighting coefficient |
| Combinations of any above | Different threshold for each check | May combine fast detection of large absolute differences And LPF filtered absolute differences with smaller threshold for deviations which remain or develop over several samples |

Additional embodiments are provided below:

1. A magnetic angle sensor system, comprising:
a first magnetic sensor configured to generate a first sensor signal in response to a first component of a magnetic field;
a second magnetic sensor configured to generate a second sensor signal in response to a second component of the magnetic field; and
at least one signal processor configured to:
generate an angle signal including an angular value corresponding to an orientation of the magnetic field based on the first sensor signal and the second sensor signal,
generate a vector length signal comprising a plurality of vector lengths corresponding to the first sensor signal and the second sensor signal based on the first sensor signal and the second sensor signal, wherein each of the plurality of vector lengths is sampled at a different sample time of a plurality of consecutive sample times,
determine a vector length variance between at least two consecutively sampled vector lengths of the plurality of vector lengths,
compare the determined vector length variance to a tolerance range defined by at least one of a minimum tolerance threshold and a maximum tolerance threshold, and
generate a warning signal on a condition that the determined vector length variance is outside the tolerance range.

2. The magnetic angle sensor system of embodiment 1, wherein the first component and the second component of the magnetic field are orthogonal to each other such that the first sensor signal and the second sensor signal are shifted 90° from each other.

3. The magnetic angle sensor system of embodiment 1, wherein the at least one signal processor is configured to determine not to generate the warning signal on a condition that the determined vector length variance is within the tolerance range.

4. The magnetic angle sensor system of embodiment 1, wherein the at least two consecutively sampled vector lengths include a first vector length and a second vector length, and the vector length variance is a differential vector length representing a difference between the first vector length and the second vector length.

5. The magnetic angle sensor system of embodiment 1, wherein the at least two consecutively sampled vector lengths include a first vector length and a second vector length, and the vector length variance is an absolute value of a differential vector length representing a difference between the first vector length and the second vector length.

6. The magnetic angle sensor system of embodiment 1, wherein the plurality of vector lengths includes a plurality of pairs of consecutively sampled vector lengths, wherein the at least one signal processor is configured to:
calculate a plurality of differential vector lengths, each corresponding to a different one of the plurality of pairs of consecutively sampled vector lengths and each representing a difference between a first vector length and a second vector length of its corresponding pair of consecutively sampled vector lengths,
calculate a plurality of absolute values, each being an absolute value of one of the plurality of differential vector lengths, and
calculate an average value of the plurality of absolute values as the vector length variance.

7. The magnetic angle sensor system of embodiment 1, wherein the plurality of vector lengths includes a plurality of pairs of consecutively sampled vector lengths, wherein the at least one signal processor is configured to:
calculate a plurality of differential vector lengths, each corresponding to a different one of the plurality of pairs of consecutively sampled vector lengths and each representing a difference between a first vector length and a second vector length of its corresponding pair of consecutively sampled vector lengths, and
determine at least one of a minimum differential vector length having a smallest value among the plurality of differential vector lengths or a maximum differential vector length having a largest value among the plurality of differential vector lengths as the vector length variance.

8. The magnetic angle sensor system of embodiment 7, wherein the at least one signal processor is configured to:
determine the minimum differential vector length of the plurality of differential vector lengths as a first vector length variance,
determine the maximum differential vector length of the plurality of differential vector lengths as a second vector length variance,
compare the first vector length variance to the tolerance range,
compare the second vector length variance to the tolerance range, and generate the warning signal on a condition that at least one of the first vector length variance or the second vector length variance is outside the tolerance range.

9. The magnetic angle sensor system of embodiment 1, wherein the plurality of vector lengths includes a plurality of pairs of consecutively sampled vector lengths, wherein the at least one signal processor is configured to:

calculate a plurality of differential vector lengths, each corresponding to a different one of the plurality of pairs of consecutively sampled vector lengths and each representing a difference between a first vector length and a second vector length of its corresponding pair of consecutively sampled vector lengths, calculate a plurality of absolute values, each being an absolute value of one of the plurality of differential vector lengths, and determine at least one of a minimum absolute value having a smallest value among the plurality of absolute values or a maximum absolute value having a largest value among the plurality of absolute values as the vector length variance.

10. The magnetic angle sensor system of embodiment 9, wherein the at least one signal processor is configured to:

determine the minimum absolute value of the plurality of absolute values as a first vector length variance, determine the maximum absolute value of the plurality of absolute values as a second vector length variance, compare the minimum absolute value to the tolerance range, compare the maximum absolute value to the tolerance range, and generate the warning signal on a condition that at least one of the first vector length variance or the second vector length variance is outside the tolerance range.

11. The magnetic angle sensor system of embodiment 1, wherein the at least one signal processor is configured to:

calculate a standard deviation of the plurality of vector lengths as the vector length variance.

12. The magnetic angle sensor system of embodiment 1, wherein the at least one signal processor configured to receive a measured temperature or a measured temperature variance and adjust the tolerance range based on the measured temperature or the measured temperature variance.

13. The magnetic angle sensor system of embodiment 1, wherein the at least one signal processor configured to receive a measured mechanical stress or a measured mechanical stress variance and adjust the tolerance range based on the measured mechanical stress or the measured mechanical stress variance.

14. The magnetic angle sensor system of embodiment 1, wherein the at least one signal processor configured to:

adjust the tolerance range based on the angular value or an angular variance between at least two consecutive angular values.

15. The magnetic angle sensor system of embodiment 1, further comprising:

a temperature sensor configured to measure a temperature; and a stress sensor configured to measure a mechanical stress, wherein the at least one signal processor configured to:
receive the angle signal, and
adjust the tolerance range based on the measured temperature, the measured mechanical stress, and the angular value.

16. The magnetic angle sensor system of embodiment 15, wherein the at least one signal processor is configured to sample the angular value at a first sampling rate, sample the plurality of vector lengths at a second sampling rate that is equal to or less than the first sampling rate, sample the measured temperature at a third sampling rate that is equal to or less than the first sampling rate, and sample the measured stress at a fourth sampling rate that is equal to or less than the first sampling rate.

17. A magnetic angle sensor system, comprising:

a first magnetic sensor configured to generate a first sensor signal in response to a first component of a magnetic field;

a second magnetic sensor configured to generate a second sensor signal in response to a second component of the magnetic field; and at least one signal processor configured to:

generate an angle signal including an angular value corresponding to an orientation of the magnetic field based on the first sensor signal and the second sensor signal, generate a vector length signal comprising a plurality of vector lengths corresponding to the first sensor signal and the second sensor signal based on the first sensor signal and the second sensor signal, wherein each of the plurality of vector lengths is sampled at a different sample time of a plurality of consecutive sample times, extract at least one spectral component of the vector length signal, the at least one spectral component being indicative of a vector length variance between at least two consecutively sampled vector lengths of the plurality of vector lengths, and generate a warning signal on a condition that the at least one extracted spectral component is outside a tolerance range.

18. The magnetic angle sensor system of embodiment 17, wherein:

the at least one signal processor comprises a high pass filter or a band pass filter configured to receive the vector length signal and generate a filter-passed vector length signal comprising the at least one extracted spectral component.

19. The magnetic angle sensor system of embodiment 17, wherein the at least one signal processor is configured to:

convert the vector length signal from a time domain into a frequency domain to generate a frequency domain vector length signal comprising the at least one extracted spectral component, calculate a sum or weighted sum of a magnitude of the at least one extracted spectral component, compare the sum or the weighted sum to the tolerance range, and generate the warning signal on a condition that the sum or the weighted sum is outside the tolerance range.

20. The magnetic angle sensor system of embodiment 17, wherein the at least one signal processor is configured to receive a measured temperature or a measured temperature variance and adjust the tolerance range based on the measured temperature or the measured temperature variance.

21. The magnetic angle sensor system of embodiment 17, wherein the at least one signal processor is configured to receive a measured mechanical stress or a measured mechanical stress variance and adjust the tolerance range based on the measured mechanical stress or the measured mechanical stress variance.

22. The magnetic angle sensor system of embodiment 17, wherein the at least one signal processor is configured to:

adjust the tolerance range based on the angular value or an angular variance between at least two consecutive angular values.

23. The magnetic angle sensor system of embodiment 17, further comprising:
a temperature sensor configured to measure a temperature; and
a stress sensor configured to measure a mechanical stress, wherein the at least one signal processor configured to:
receive the angle signal, and
adjust the tolerance range based on the measured temperature, the measured mechanical stress, and the angular value.

24. A method of performing a vector length variance check, the method comprising:
generating a first sensor signal in response to a first component of a magnetic field;
generating a second sensor signal in response to a second component of the magnetic field;
generating an angle signal including an angular value corresponding to an orientation of the magnetic field based on the first sensor signal and the second sensor signal;
generating a vector length signal comprising a plurality of vector lengths corresponding to the first sensor signal and the second sensor signal based on the first sensor signal and the second sensor signal, wherein each of the plurality of vector lengths is sampled at a different sample time of a plurality of consecutive sample times;
determining a vector length variance between at least two consecutively sampled vector lengths of the plurality of vector lengths;
comparing the determined vector length variance to a tolerance range defined by at least one of a minimum tolerance threshold and a maximum tolerance threshold; and
generating a warning signal on a condition that the determined vector length variance is outside the tolerance range.

25. The method of performing the vector length variance check of embodiment 24, further comprising:
determining not to generate the warning signal on a condition that the determined vector length variance is within the tolerance range.

26. The method of performing the vector length variance check of embodiment 24, wherein the at least two consecutively sampled vector lengths include a first vector length and a second vector length, and the vector length variance is a differential vector length representing a difference between the first vector length and the second vector length.

27. The method of performing the vector length variance check of embodiment 24, wherein the plurality of vector lengths includes a plurality of pairs of consecutively sampled vector lengths, the method further comprising:
calculating a plurality of differential vector lengths, each corresponding to a different one of the plurality of pairs of consecutively sampled vector lengths and each representing a difference between a first vector length and a second vector length of its corresponding pair of consecutively sampled vector lengths; and
calculating an average value of the plurality of differential vector lengths as the vector length variance.

28. The method of performing the vector length variance check of embodiment 24, wherein the at least two consecutively sampled vector lengths include a first vector length and a second vector length, and the vector length variance is an absolute value of a differential vector length representing a difference between the first vector length and the second vector length.

29. The method of performing the vector length variance check of embodiment 24, wherein the plurality of vector lengths includes a plurality of pairs of consecutively sampled vector lengths, the method further comprising:
calculating a plurality of differential vector lengths, each corresponding to a different one of the plurality of pairs of consecutively sampled vector lengths and each representing a difference between a first vector length and a second vector length of its corresponding pair of consecutively sampled vector lengths;
calculating a plurality of absolute values, each being an absolute value of one of the plurality of differential vector lengths; and
calculating an average value of the plurality of absolute values as the vector length variance.

30. The method of performing the vector length variance check of embodiment 24, wherein the plurality of vector lengths includes a plurality of pairs of consecutively sampled vector lengths, the method further comprising:
calculating a plurality of differential vector lengths, each corresponding to a different one of the plurality of pairs of consecutively sampled vector lengths and each representing a difference between a first vector length and a second vector length of its corresponding pair of consecutively sampled vector lengths; and
determining at least one of a minimum differential vector length having a smallest value among the plurality of differential vector lengths or a maximum differential vector length having a largest value among the plurality of differential vector lengths as the vector length variance.

31. The method of performing the vector length variance check of embodiment 30, further comprising:
determining the minimum differential vector length of the plurality of differential vector lengths as a first vector length variance;
determining the maximum differential vector length of the plurality of differential vector lengths as a second vector length variance;
comparing the first vector length variance to the tolerance range;
comparing the second vector length variance to the tolerance range; and
generating the warning signal on a condition that at least one of the first vector length variance or the second vector length variance is outside the tolerance range.

32. The method of performing the vector length variance check of embodiment 24, wherein the plurality of vector lengths includes a plurality of pairs of consecutively sampled vector lengths, the method further comprising:
calculating a plurality of differential vector lengths, each corresponding to a different one of the plurality of pairs of consecutively sampled vector lengths and each representing a difference between a first vector length and a second vector length of its corresponding pair of consecutively sampled vector lengths;
calculating a plurality of absolute values, each being an absolute value of one of the plurality of differential vector lengths; and
determining at least one of a minimum absolute value having a smallest value among the plurality of absolute values or a maximum absolute value having a largest value among the plurality of absolute values as the vector length variance.

33. The method of performing the vector length variance check of embodiment 32, further comprising:
determining the minimum absolute value of the plurality of absolute values as a first vector length variance;
determining the maximum absolute value of the plurality of absolute values as a second vector length variance;

comparing the minimum absolute value to the tolerance range;

comparing the maximum absolute value to the tolerance range; and generating the warning signal on a condition that at least one of the first vector length variance or the second vector length variance is outside the tolerance range.

34. The method of performing the vector length variance check of embodiment 24, further comprising:

calculating a standard deviation of the plurality of vector lengths as the vector length variance.

35. The method of performing the vector length variance check of embodiment 24, further comprising:

adjusting the tolerance range based on a measured temperature or a measured temperature variance.

36. The method of performing the vector length variance check of embodiment 24, further comprising:

adjusting the tolerance range based on a measured mechanical stress or a measured mechanical stress variance.

37. The method of performing the vector length variance check of embodiment 24, further comprising:

adjusting the tolerance range based on the angular value or an angular variance between at least two consecutive angular values.

38. The method of performing the vector length variance check of embodiment 24, further comprising:

adjusting the tolerance range based on a measured temperature, a measured mechanical stress, and the angular value.

39. The method of performing the vector length variance check of embodiment 38, further comprising:

sampling the measured temperature, the measured mechanical stress, and the angular value at a first sampling rate, a second sampling rate, and a third sampling rate, respectively; and sampling the plurality of vector lengths at a fourth sampling rate, wherein the first, the second, and the fourth sampling rates are equal to or less than the third sampling rate.

40. A method of performing a vector length variance check, the method comprising:

generating a first sensor signal in response to a first component of a magnetic field;

generating a second sensor signal in response to a second component of the magnetic field;

generating an angle signal including an angular value corresponding to an orientation of the magnetic field based on the first sensor signal and the second sensor signal;

generating a vector length signal comprising a plurality of vector lengths corresponding to the first sensor signal and the second sensor signal based on the first sensor signal and the second sensor signal, wherein each of the plurality of vector lengths is sampled at a different sample time of a plurality of consecutive sample times;

extracting at least one spectral component of the vector length signal, the at least one spectral component being indicative of a vector length variance between at least two consecutively sampled vector lengths of the plurality of vector lengths; and generating a warning signal on a condition that the at least one extracted spectral component is outside a tolerance range.

41. The method of performing the vector length variance check of embodiment 40, further comprising:

providing the vector length signal to a high pass filter or a band pass filter to generate a filter-passed vector length signal comprising the at least one extracted spectral component.

42. The method of performing the vector length variance check of embodiment 40, further comprising:

converting the vector length signal from a time domain into a frequency domain to generate a frequency domain vector length signal comprising the at least one extracted spectral component;

calculating a sum or weighted sum of a magnitude of the at least one extracted spectral component;

comparing the sum or the weighted sum to the tolerance range; and generating the warning signal on a condition that the sum or the weighted sum is outside the tolerance range.

43. The method of performing the vector length variance check of embodiment 40, further comprising:

adjusting the tolerance range based on a measured temperature or a measured temperature variance.

44. The method of performing the vector length variance check of embodiment 40, further comprising:

adjusting the tolerance range based on a measured mechanical stress or a measured mechanical stress variance.

45. The method of performing the vector length variance check of embodiment 40, further comprising:

adjusting the tolerance range based on the angular value or an angular variance between at least two consecutive angular values.

46. The method of performing the vector length variance check of embodiment 40, further comprising:

adjusting the tolerance range based on a measured temperature, a measured mechanical stress, and the angular value.

47. The method of performing the vector length variance check of embodiment 46, further comprising:

sampling the measured temperature, the measured mechanical stress, and the angular value at a first sampling rate, a second sampling rate, and a third sampling rate, respectively; and sampling the plurality of vector lengths at a fourth sampling rate, wherein the first, the second, and the fourth sampling rates are equal to or less than the third sampling rate.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. Such hardware, software, and firmware may be implemented within the same device or within separate devices to support the various techniques described in this disclosure.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A magnetic angle sensor system, comprising:
   a first magnetic sensor configured to generate a first sensor signal in response to a first component of a magnetic field;
   a second magnetic sensor configured to generate a second sensor signal in response to a second component of the magnetic field; and
   at least one signal processor configured to:
      generate an angle signal including an angular value corresponding to an orientation of the magnetic field based on the first sensor signal and the second sensor signal,
      generate a vector length signal comprising a plurality of vector lengths corresponding to the first sensor signal and the second sensor signal based on the first sensor signal and the second sensor signal, wherein each of the plurality of vector lengths is sampled at a different sample time of a plurality of consecutive sample times,
      determine a vector length variance between at least two consecutively sampled vector lengths of the plurality of vector lengths,
      compare the determined vector length variance to a tolerance range defined by at least one of a minimum tolerance threshold and a maximum tolerance threshold, and
      generate a warning signal on a condition that the determined vector length variance is outside the tolerance range.

2. The magnetic angle sensor system of claim 1, wherein the first component and the second component of the magnetic field are orthogonal to each other such that the first sensor signal and the second sensor signal are shifted 90° from each other.

3. The magnetic angle sensor system of claim 1, wherein the at least one signal processor is configured to determine not to generate the warning signal on a condition that the determined vector length variance is within the tolerance range.

4. The magnetic angle sensor system of claim 1, wherein the at least two consecutively sampled vector lengths include a first vector length and a second vector length, and the vector length variance is a differential vector length representing a difference between the first vector length and the second vector length.

5. The magnetic angle sensor system of claim 1, wherein the at least two consecutively sampled vector lengths include a first vector length and a second vector length, and the vector length variance is an absolute value of a differential vector length representing a difference between the first vector length and the second vector length.

6. The magnetic angle sensor system of claim 1, wherein the plurality of vector lengths includes a plurality of pairs of consecutively sampled vector lengths, wherein the at least one signal processor is configured to:
   calculate a plurality of differential vector lengths, each corresponding to a different one of the plurality of pairs of consecutively sampled vector lengths and each representing a difference between a first vector length and a second vector length of its corresponding pair of consecutively sampled vector lengths,
   calculate a plurality of absolute values, each being an absolute value of one of the plurality of differential vector lengths, and
   calculate an average value of the plurality of absolute values as the vector length variance.

7. The magnetic angle sensor system of claim 1, wherein the plurality of vector lengths includes a plurality of pairs of consecutively sampled vector lengths, wherein the at least one signal processor is configured to:
   calculate a plurality of differential vector lengths, each corresponding to a different one of the plurality of pairs of consecutively sampled vector lengths and each representing a difference between a first vector length and a second vector length of its corresponding pair of consecutively sampled vector lengths, and
   determine at least one of a minimum differential vector length having a smallest value among the plurality of differential vector lengths or a maximum differential vector length having a largest value among the plurality of differential vector lengths as the vector length variance.

8. The magnetic angle sensor system of claim 7, wherein the at least one signal processor is configured to:
    determine the minimum differential vector length of the plurality of differential vector lengths as a first vector length variance,
    determine the maximum differential vector length of the plurality of differential vector lengths as a second vector length variance,
    compare the first vector length variance to the tolerance range,
    compare the second vector length variance to the tolerance range, and
    generate the warning signal on a condition that at least one of the first vector length variance or the second vector length variance is outside the tolerance range.

9. The magnetic angle sensor system of claim 1, wherein the plurality of vector lengths includes a plurality of pairs of consecutively sampled vector lengths, wherein the at least one signal processor is configured to:
    calculate a plurality of differential vector lengths, each corresponding to a different one of the plurality of pairs of consecutively sampled vector lengths and each representing a difference between a first vector length and a second vector length of its corresponding pair of consecutively sampled vector lengths,
    calculate a plurality of absolute values, each being an absolute value of one of the plurality of differential vector lengths, and
    determine at least one of a minimum absolute value having a smallest value among the plurality of absolute values or a maximum absolute value having a largest value among the plurality of absolute values as the vector length variance.

10. The magnetic angle sensor system of claim 9, wherein the at least one signal processor is configured to:
    determine the minimum absolute value of the plurality of absolute values as a first vector length variance,
    determine the maximum absolute value of the plurality of absolute values as a second vector length variance,
    compare the minimum absolute value to the tolerance range,
    compare the maximum absolute value to the tolerance range, and
    generate the warning signal on a condition that at least one of the first vector length variance or the second vector length variance is outside the tolerance range.

11. The magnetic angle sensor system of claim 1, wherein the at least one signal processor is configured to:
    calculate a standard deviation of the plurality of vector lengths as the vector length variance.

12. The magnetic angle sensor system of claim 1, wherein the at least one signal processor configured to receive a measured temperature or a measured temperature variance and adjust the tolerance range based on the measured temperature or the measured temperature variance.

13. The magnetic angle sensor system of claim 1, wherein the at least one signal processor configured to receive a measured mechanical stress or a measured mechanical stress variance and adjust the tolerance range based on the measured mechanical stress or the measured mechanical stress variance.

14. The magnetic angle sensor system of claim 1, wherein the at least one signal processor configured to:
    adjust the tolerance range based on the angular value or an angular variance between at least two consecutive angular values.

15. A method of performing a vector length variance check, the method comprising:
    generating a first sensor signal in response to a first component of a magnetic field;
    generating a second sensor signal in response to a second component of the magnetic field;
    generating an angle signal including an angular value corresponding to an orientation of the magnetic field based on the first sensor signal and the second sensor signal;
    generating a vector length signal comprising a plurality of vector lengths corresponding to the first sensor signal and the second sensor signal based on the first sensor signal and the second sensor signal, wherein each of the plurality of vector lengths is sampled at a different sample time of a plurality of consecutive sample times;
    determining a vector length variance between at least two consecutively sampled vector lengths of the plurality of vector lengths;
    comparing the determined vector length variance to a tolerance range defined by at least one of a minimum tolerance threshold and a maximum tolerance threshold; and
    generating a warning signal on a condition that the determined vector length variance is outside the tolerance range.

16. The method of performing the vector length variance check of claim 15, further comprising:
    determining not to generate the warning signal on a condition that the determined vector length variance is within the tolerance range.

17. The method of performing the vector length variance check of claim 15, wherein the at least two consecutively sampled vector lengths include a first vector length and a second vector length, and the vector length variance is a differential vector length representing a difference between the first vector length and the second vector length.

18. The method of performing the vector length variance check of claim 15, wherein the plurality of vector lengths includes a plurality of pairs of consecutively sampled vector lengths, the method further comprising:
    calculating a plurality of differential vector lengths, each corresponding to a different one of the plurality of pairs of consecutively sampled vector lengths and each representing a difference between a first vector length and a second vector length of its corresponding pair of consecutively sampled vector lengths; and
    calculating an average value of the plurality of differential vector lengths as the vector length variance.

19. The method of performing the vector length variance check of claim 15, wherein the at least two consecutively sampled vector lengths include a first vector length and a second vector length, and the vector length variance is an absolute value of a differential vector length representing a difference between the first vector length and the second vector length.

20. The method of performing the vector length variance check of claim 15, wherein the plurality of vector lengths includes a plurality of pairs of consecutively sampled vector lengths, the method further comprising:
    calculating a plurality of differential vector lengths, each corresponding to a different one of the plurality of pairs of consecutively sampled vector lengths and each representing a difference between a first vector length and a second vector length of its corresponding pair of consecutively sampled vector lengths;

calculating a plurality of absolute values, each being an absolute value of one of the plurality of differential vector lengths; and calculating an average value of the plurality of absolute values as the vector length variance.

* * * * *